United States Patent [19]

Ogata et al.

[11] Patent Number: 5,592,134
[45] Date of Patent: Jan. 7, 1997

[54] EMI FILTER WITH A CERAMIC MATERIAL HAVING A CHEMICAL REACTION INHIBITING COMPONENT

[75] Inventors: Yasuyuki Ogata; Yoshimasa Hayashi; Yasushi Kojima, all of Saitama-ken, Japan

[73] Assignee: Mitsubishi Materials Corporation, Tokyo, Japan

[21] Appl. No.: 384,536

[22] Filed: Feb. 8, 1995

[30] Foreign Application Priority Data

| Feb. 9, 1994 | [JP] | Japan | 6-015319 |
| Feb. 23, 1994 | [JP] | Japan | 6-025357 |
| Mar. 8, 1994 | [JP] | Japan | 6-036804 |
| Mar. 25, 1994 | [JP] | Japan | 6-055408 |

[51] Int. Cl.$^6$ .......................... H03H 7/01; G04B 35/48
[52] U.S. Cl. .......................... 333/185; 501/134
[58] Field of Search .......................... 333/185; 501/134; 252/62.9; 336/200

[56] References Cited

U.S. PATENT DOCUMENTS

| 5,029,043 | 7/1991 | Kitahara et al. | 336/200 X |
| 5,126,707 | 6/1992 | Ikeda | 333/185 |
| 5,134,095 | 7/1992 | Omi et al. | 501/47 |
| 5,392,019 | 2/1995 | Ohkubo | 336/200 |

FOREIGN PATENT DOCUMENTS

| 2756715 | 8/1979 | Germany. |
| 4158614 | 6/1992 | Japan. |
| 4257111 | 9/1992 | Japan. |

OTHER PUBLICATIONS

Leibler et al., *New Two-and Three-phase Ferroelectric-Ferromagnetic Materials*, 1971, ACTA Physica Polonicay vol. A40 pp. 815–827.

*Primary Examiner*—Benny T. Lee
*Assistant Examiner*—Justin P. Bettendorf
*Attorney, Agent, or Firm*—McAulay, Fisher, Nissen, Goldberg & Kiel, LLP

[57] ABSTRACT

A composite ceramic material which is available by sintering a mixed powder of a dielectric material and a magnetic material, and contains a third component serving to inhibit a chemical reaction between the dielectric material and the magnetic material during sintering of the mixed powder and reduce the sintering temperature, and particularly, an EMI filter, a composite LC pan and a composite LC chip part made from such a composite ceramic material. The starting end and the terminal end of the inductor are exposed on the both end faces of the bare chip, and signal electrodes are provided at these ends. Ends of the conductors for grounding are exposed on the other both ends of the bare chip, and grounding electrodes are provided at these ends. The conductors for inductor are spirally connected in succession in the thickness direction of the bare chip via throughholes provided in the sheets within the bare chip to form an inductor. The conductors for grounding are adjacent to, and spaced apart by a distance sufficient for insulation from the conductors for inductor in a plane within the bare chip and piled up alternately with the conductors for inductor to form capacitors each between a conductor for grounding and a conductor for the inductor.

12 Claims, 5 Drawing Sheets

5,592,134

EMI FILTER WITH A CERAMIC MATERIAL HAVING A CHEMICAL REACTION INHIBITING COMPONENT

FIELD OF THE INVENTION

The present invention relates to a composite ceramic material, which is useful as a material for electronic parts, and particularly, an EMI filter, a composite LC part and a composite LC chip part.

BACKGROUND OF THE INVENTION

In the area of electronic parts, dielectric and magnetic materials play important roles, the former being popularly used as materials mainly for capacitors, and the latter being popularly used as materials mainly for inductors. The capacitors and inductors are manufactured from the respective materials.

An EMI filter conventionally used for a signal line, for example, is manufactured in general by combining individual elements of the capacitor and inductor as described above. It has, however, been impossible to achieve downsizing of the product with the conventional EMI filter composed of a combination of the individual elements of a capacitor or an inductor.

To solve this problem, it has conventionally been tried to manufacture an EMI filter combining the functions of capacitance with those for inductance by using a composite ceramic material prepared by mixing dielectric and magnetic materials and sintering the mixture.

Sintering a mixture of dielectric and magnetic materials at a high temperature has however led to a reaction between the dielectric and magnetic materials. This has resulted in difficulties such as deterioration of the respective properties and impairment of the sintering reproducibility, as well as deterioration of the EMI filter properties and impairment of reproducibility.

Various composite LC parts and composite LC chip parts having a monolithic structure combining an inductor and a capacitor have been proposed. For example, the present inventors proposed a composite LC part manufactured by forming a laminate for a capacitor comprising alternately printed and laminated dielectric ceramic to layers and conductors for the capacitor, forming a laminate for the inductor comprising alternately printed and laminated ceramic layers of a magnetic material and conductors for the inductor on this laminate for the capacitor or separately therefrom, integrally sintering these laminates for the capacitor and laminates for the inductor interposed with an intermediary layer in between, and providing an appropriate external terminal at an end of the laminate having the exposed inner conductors therein (Japanese Laid Open Patent Publication No. 3-166,810, for example). In the laminate for the inductor of this composite LC part, a helical inductor is formed vertically to the layers, i.e., in the thickness direction, by connecting each layer of the conductors for the inductor formed on the ceramic layers via a hole through the ceramic layers.

As another composite LC part, the present inventors developed a Φ-type LC filter, in which a laminated chip inductor comprising a sintered ferrite having an inner electrode provided therein and a laminated chip capacitor comprising a sintered dielectric material having an internal electrode and a grounding electrode are integrally combined with an adhesive, and the external electrodes of the laminated chip inductor and the laminated chip capacitor are electrically connected (Japanese Laid Open Patent Application No. 6-325,977).

Furthermore, another composite LC part is proposed, in which the ceramic layers forming the laminate for the inductor and the ceramic layers forming the laminate for the capacitor are prepared from ceramic dielectric materials. The laminates for the inductor and the capacitor are integrally sintered in a superposed state, and an appropriate external terminal is provided at an end where an internal conductor is exposed.

However, in the composite LC part disclosed in Japanese Laid Open Patent Publication No. 3-166,810, the difference in the coefficient of thermal shrinkage between the lamination for the capacitor and the lamination for the inductor causes heat stress during sintering. This results in unavoidable strain, cracks and fluctuations of the properties even in the intermediate layers. This produces inferior yield and reliability of the product.

In the Φ-type LC filter disclosed in Japanese Laid Open Patent Application No. 6-325,977, which is free from the defects as described above, it is necessary to separately sinter the laminated chip inductor and the laminated chip capacitor, and control of the production of the chip inductor and the chip capacitor is complicated and troublesome, which makes it difficult downsize the product.

In the composite LC part formed exclusively from a dielectric material the inductance available is insufficient when used for noise removal, and since all the windings of the coil pattern forming the inductor always contain the dielectric material in between, a large floating capacity between the windings results which makes it impossible to obtain the desired performance.

OBJECT AND SUMMARY OF THE INVENTION

The present invention has an object to solve the above-mentioned conventional problems and to provide a composite ceramic material wherein any reaction between the dielectric material and magnetic material during sintering is inhibited as much as possible and is free from deterioration of its properties.

Another object of the present invention is to solve the above-mentioned conventional problems and to provide an EMI filter wherein any reaction between the dielectric and magnetic materials during sintering is inhibited as much as possible, is free from deterioration its properties, and whose properties may be consistently reproduced.

A further another object of the present invention is to provide a composite LC part and a composite LC chip part in which thermal stress during sintering is reduced to a minimum, and which are less susceptible to strain, cracks or fluctuations of properties.

Another object of the present invention is to provide a composite LC part and a composite LC chip part which have a small floating capacity between the windings of the coil pattern forming the inductor, and are excellent in noise removal.

A further another object of the present invention is to provide a composite LC part and a composite LC chip part which permit surface mounting onto a printed circuit substrate or the like, are small in size, and high in productivity.

The composite ceramic material of the present invention is obtained by sintering a mixed powder of a dielectric material and a magnetic material, and is characterized in that it contains a third substance to inhibit the reaction between the dielectric material and the magnetic material during sintering of the mixed powder and to reduce the sintering temperatures.

The third substance as described above is preferably a CdO—ZnO—B$_2$O$_3$-based substance.

In the present invention, the third substance is added to the sintering raw materials to inhibit the chemical reaction between the dielectric and the magnetic materials during sintering. Also, the sintering temperature is reduced to further prevent a chemical reaction between the dielectric and magnetic materials through low-temperature sintering.

The EMI filter of the present invention is a three-terminal capacitor-shaped EMI filter comprising a mixed sintered material of the dielectric and magnetic materials. This mixed sintered material is characterized in that it contains a third substance to inhibit any chemical reaction between the dielectric and magnetic materials and to reduce the sintering temperature.

BRIEF DESCRIPTION OF THE DRAWINGS

FIG. 2 (b) is a perspective view illustrating the composite LC part;

FIG. 6 (b) is a perspective view illustrating the composite LC chip part;

DETAILED DESCRIPTION OF THE INVENTION

Figure 1:
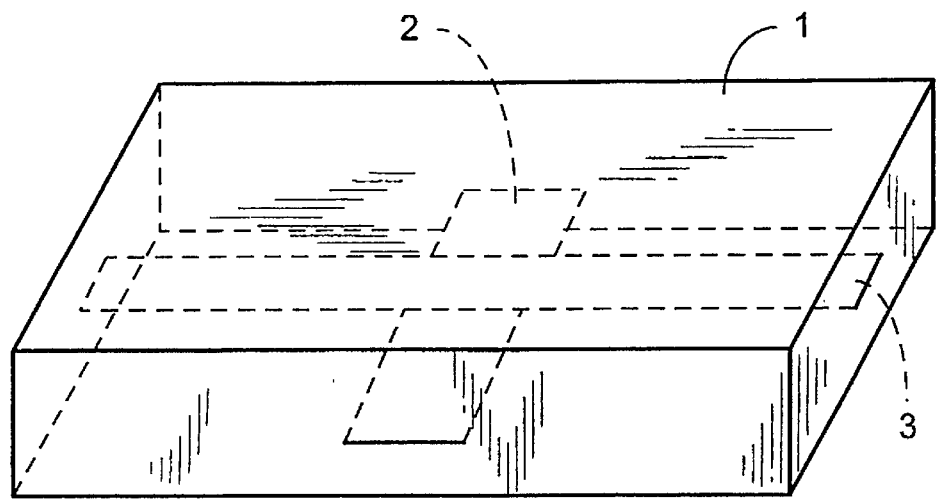
FIG. 1 is a perspective view illustrating an EMI filter chip.

The third substance used in the present invention can be any substance which can inhibit the chemical reaction between the dielectric and magnetic materials during sintering and reduce the sintering temperature, varying with kinds (compositions) and percentage of the dielectric and magnetic materials used. The third substance is preferably a CdO—ZnO—B$_2$O$_3$-based substance obtained by calcining a mixture of CdO, ZnO and B$_2$O$_3$ at the following ratios at a temperature of from 600° to 1,000° C:

CdO: from 10 to 40 mol. %,

ZnO: from 30 to 60 mol. %,

B$_2$O$_3$: from 10 to 40 mol. %.

In the present invention, there is no particular limitation on the compositions of the dielectric and magnetic materials, combination of the dielectric and magnetic materials, and the mixing ratios thereof, which are determined in accordance with the purpose of use of the composite ceramic material to be manufactured.

In general, suitable dielectric materials include relaxor-type materials, and a suitable magnetic material is Ni—Zn ferrite or Ni—Zn—Cu ferrite.

More specifically, applicable dielectric materials and magnetic materials include:

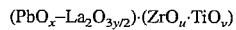

wherein:

$x+y=1$ ($x=0.80$ to $0.99$)

$u+v=1$ ($u=0.50$ to $0.85$)

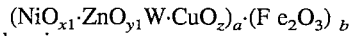

wherein:

$x_1+y_1+z=a$ $a=0.505$ to $0.530$ $x_1=0.10$ to $0.35$ $b=0.495$ to $0.470$ $y_1=0.10$ to $0.365$ $a+b=1$ $z=0.00$ to $0.20$

The ratio of the dielectric material to the magnetic material depending upon specific inductive capacity of the dielectric material and magnetic permeability of the magnetic material, is preferably be from 20 to 80 wt. % for the dielectric material and from 20 to 80 wt. % for the magnetic material.

Since a very large amount of added third substance may impair the properties of the target composite ceramic material or the EMI filter, and a very small amount makes it impossible to obtain a sufficient improvement, the amount of added third substance is preferably within the range of from 0.05 to 3 wt. %, or more preferably, of from 0.1 to 2 wt. % relative to the total with the dielectric and magnetic materials.

The composite ceramic material and the EMI filter of the present invention can be manufactured by mixing the dielectric material powder, the magnetic material powder and the third substance powder at prescribed ratios, and calcining the resultant mixed powder at a temperature of from 850° to 1,000° C.

Blending of the third substance prevents a chemical reaction between the dielectric material and the magnetic material during sintering. Also, the low temperature sintering because of the reducing effect of the sintering temperature due to the third substance permits further inhibition of any chemical reaction between the dielectric material and the magnetic material. This almost completely eliminates the chance of a chemical reaction between the dielectric material and the magnetic material during sintering.

The construction of the composite LC part of the present invention is described with reference to FIG. 2 corresponding to an inventive embodiment. As shown therein, the composite LC part 10 of the present invention mainly comprises a bare chip 41 manufactured by preparing a number of green sheets made from a composite ceramic material comprising a magnetic ferrite powder, a dielectric ceramic powder and a third substance serving to inhibit the chemical reaction between the magnetic ferrite powder and the dielectric ceramic powder and to reduce the sintering temperature of the mixture. The components are mixed at a prescribed ratio and a laminate is formed from the thus prepared green sheets 11 to 16. Conductors for inductor 22 to 26 and conductors for grounding, 32 to 36 are formed on each of the green sheets before laminating except for at least the first green sheet such that the conductors for the inductor and the conductors for grounding are insulated electrically.

The thus formed chip-shaped laminate is then sintered. The conductors for the inductor 22 to 26 are arranged so as to form, in the interior of the bare chip, a continuous spiral inductor running in the thickness direction of the bare chip 41 via throughholes 12a to 15a formed in sheets 12 to 15. The starting end 22a thereof is exposed on a first end face of the bare chip 41, and the terminal end 26a is exposed on a second end face of the bare chip 41. The conductors for grounding 32 to 36 are arranged, respectively, so as to be adjacent to, and spaced apart for insulation from, the conductors for the inductor 22 to 26, in a same plane in the interior of the bare chip, and are piled up with the conductors for the inductor except a conductor for the inductor in the same plane, with the green sheets 12 to 15 interposed in between, such that capacitors are formed between the conductors for grounding 32 to 36 and the conductors for the inductor 22 to 26. Ends thereof 32a to 26a on a side are exposed on third and fourth end faces of the bare chip 41.

First and second signal electrodes 42 and 43 which are electrically connected to the starting end 22a and the terminal end 26a, respectively, of the conductors for the inductor exposed on the first and second end faces of the bare chip 41 are provided on the first and second end faces, and first and second grounding electrodes 44 and 45 which are electrically connected to the ends 32a to 36a of the conductors for grounding are exposed on the third and fourth end faces of the bare chip 41 are provided on the third and fourth end faces.

In this composite LC part 10, in which the inductor and the capacitors are formed with the green sheets made from the same ceramic material, it is possible to simplify the manufacturing process and to minimize thermal stress during sintering, thus avoiding problems such as strain or cracks in the bare chip.

Since the conductors for grounding are arranged in the same plane as the conductors for the inductor adjacent thereto or vertically adjacent to the conductors for the inductor, the inductor formed by these conductors for the inductor is susceptible to only a minimum occurrence of floating capacity. Furthermore, because a plurality of capacitors are formed between the conductors for the inductor and the conductors for grounding, the composite LC part of the present invention is applicable for noise removal in a wide range of frequencies.

The construction of the composite LC chip part 110 is described below with reference to FIG. 6 corresponding to another inventive embodiment.

The composite LC chip part of the present invention mainly comprises a bare chip 141 manufactured by preparing a plurality of green sheets 111 to 116 made from a composite ceramic material comprising a mixture of a magnetic ferrite powder, a dielectric ceramic powder and a third substance serving to inhibit any chemical reaction between the magnetic ferrite powder and the dielectric ceramic powder and to reduce the sintering temperature of the mixture. The components are mixed at a prescribed ratio, and a laminate is formed with the thus prepared green sheets 111 to 116. Conductors for the inductor 122 to 126 and grounding for earthing 133 and 135 are formed on the green sheets before laminating, except for at least a first green sheet such that the conductors for the inductor and the conductors for grounding are insulated electrically. Thereafter, the chip-shaped laminate is sintered.

The conductors for inductor 122 to 126 are arranged so as to form a continuous meander-shaped inductor as shown in FIG. 6 on the cut surface in the thickness direction of the bare chip 141 via throughholes 112a to 115a formed in the sheets 112 to 115 in the interior of the bare chip 141. The starting end 122a thereof is exposed on a first end face of the bare chip 141, and the terminal end 126a thereof is exposed on a second end face of the bare chip 141.

The conductors for grounding 133 and 135 are arranged so as to be adjacent to, and spaced for insulation from, conductors for inductor 123 and 125 in a same plane in the interior of the bare chip, and are piled up with other conductors for inductor 122, 124 and 126. Green sheets 112 to 115 are interposed in between, such that capacitors are formed between the conductors for grounding 133 and 135 and the conductors for inductor 122 to 126. The ends 133a, 133b, 135a and 135b are exposed on third and fourth end faces of the bare chip 141.

First and second signal electrodes 142 and 143 are electrically connected to the starting end 122a and the terminal end 126a, respectively, of the conductors for the inductor exposed on the first and second end faces of the bare chip 141 are provided on the first and second end faces.

First and second grounding electrodes 144 and 145 electrically connected to ends 133a, 133b, 135a and 135b of the grounding or grounding conductors exposed on the third and fourth end faces of the bare chip 141 are provided on the third and fourth end faces.

The composite LC chip part can comprise a bare chip 141 manufactured by preparing a plurality of green sheets 111 to 116 made from a ceramic material comprising exclusively a dielectric ceramic powder in place of the composite ceramic material formed from the magnetic ferrite powder and dielectric ceramic powder. A laminate is formed with the thus prepared green sheets 111 to 116, in which conductors for inductor 122 to 126 and conductors for grounding 133 and 135 are formed on the green sheets before laminating except for at least a first green sheet such that the conductors for inductor and the conductors for grounding are insulated electrically. The chip-shaped laminate is thus sintered.

Also in this composite LC chip part, an inductor and capacitors are formed by the use of the green sheets 112 to 116 prepared from the same ceramic material. It is therefore possible to simplify the manufacturing process, to inhibit thermal stress to a minimum during sintering, and to avoid problems, such as strain and cracks in the bare chip 141.

Since the conductors for grounding 133 and 135 are arranged in the same plane as the conductors for inductor 122 to 126 or vertically adjacent to the conductors for inductor 122 to 126, the inductor thus formed shows minimal susceptibility to the occurrence of floating capacity. Furthermore, because the capacitors are formed between the conductors for inductor 122 to 126 and the conductors for grounding 133 and 135, the composite LC chip part of the present invention can be used for noise removal in a wide range of frequencies.

By altering the current path for the conductors serving as conductors for a signal line in proportion to the number of layers of green sheets in the laminate, it is possible to increase or decrease the inductance and capacitance.

The present invention is described below in further detail by means of examples and comparative examples.

A dielectric material and a magnetic material manufactured as follows were used in these examples.

Dielectric material: A dielectric material represented by $Pb_{0.88}La_{0.12}Zr_{0.7}Ti_{0.3}O_{3.06}$ was obtained by using PbO, $La_2O_3$, $ZrO_2$ and $TiO_2$ as starting raw materials, mixing these starting raw materials at molar ratios of 88:6:70:30, respectively, and calcining the mixture at 1,150° C.

Magnetic material: A magnetic material represented by $Ni_{0.24}Zn_{0.22}Cu_{0.05}Fe_{0.96}O_{1.96}$ was obtained by using NiO, ZnO, CuO and $Fe_2O_3$ as starting raw materials, mixing these starting raw materials at molar ratios of 24:22:6:48, respectively, and calcining the mixture at 1,000° C.

EXAMPLES 1 to 5

CdO, ZnO and $B_2O_3$ as starting raw materials were mixed at ratios as shown in Table 1 and calcined at 900° C. to obtain $CdO-ZnO-B_2O_3$-based third substances.

Each of the thus obtained third substances was mixed with the dielectric material and the magnetic material at the corresponding ratio as shown in Table 1, and the mixture was sintered at the corresponding temperature shown in Table 1 to obtain a composite ceramic material.

X-ray diffraction patterns of the composite ceramic materials thus obtained were investigated: in all cases, patterns exclusively of the magnetic material and the dielectric material were observed, with no peak of any unknown substance suggesting a reaction between the dielectric material and the magnetic material.

COMPARATIVE EXAMPLE 1

Manufacture of a composite ceramic material was tried in the same manner as in the Example 1 except that no third substance was used. Sufficient sintering could not however be achieved, and it was consequently impossible to obtain a composite ceramic material capable of being commercialized.

Investigation of the X-ray diffraction pattern of the thus obtained composite ceramic material revealed peaks of unknown substances other than the dielectric and magnetic materials.

COMPARATIVE EXAMPLE 2

A composite ceramic material was manufactured in the same manner as in Example 1 except that no third substance was used and the mixture was sintered at a higher temperature as shown in Table 1.

While sintering could be achieved, investigation of the X-ray diffraction pattern of the composite ceramic material revealed many peaks of unknown substances other than the dielectric and magnetic materials.

EXAMPLES 6 TO 9

CdO, ZnO and $B_2O_3$ as starting raw materials were mixed at the ratios shown in Table 2 and calcined at 900° C. to obtain $CdO-ZnO-B_2O_3$-based third substances.

Each of the thus obtained third substances was mixed with the dielectric material and the magnetic material at the corresponding ratio as shown in Table 2; the resultant mixed powder was mixed and kneaded with a binder (polyvinylbutyral) in an amount of 10 wt. % to prepare ceramic sheets having a thickness of 30 μm by the application of the doctor blade method. Fifty such ceramic sheets were formed into a laminate. In the course of the lamination, internal electrodes (a grounding and a signal electrode) were printed, and after hot press adhesion of the laminate, it was cut into EMI filter chips of a three-terminal capacitor type as shown in FIG. 1. In FIG. 1, 1 is a sintered ceramics, 2 is a grounding electrode, and 3 is a signal electrode.

Each of 1,000 chips thus formed was sintered at a temperature as shown in Table 2 for two hours, and terminal electrodes were attached to each of the chips to measure the electrostatic capacity between the grounding electrode and the signal electrode, and to measure impedance at the both ends of the signal electrode. As is clear from the results shown in Table 2, high-performance EMI filters were obtained with a high reproducibility of the electrostatic capacity and the impedance in all cases.

As a result of investigation of the X-ray diffraction pattern of the ceramic portion of each of the resultant chips, patterns of only the magnetic and dielectric materials were observed in all cases, with no peak of any unknown substance suggesting a reaction between the magnetic and dielectric materials.

COMPARATIVE EXAMPLES 3

Manufacture of chips was tired in the same manner as in the Example 1 except that no third substance was used. Sufficient sintering could not however be achieved, with very poor properties as shown in Table 2, thus making it impossible to obtain chips capable of being commercialized.

Investigation of the X-ray diffraction pattern of the ceramic portions of the thus obtained chips revealed peaks

TABLE 1

| Example | Composition of third substance (mole %) | | | Blending ratio of raw materials (wt. %) | | | Sintering Temp. (°C.) | Remarks |
|---|---|---|---|---|---|---|---|---|
| | CdO | ZnO | $B_2O_3$ | Dielectric Material | Magnetic Material | Third Substance | | |
| Example | | | | | | | | |
| 1 | 33.3 | 33.3 | 33.3 | 60 | 40 | 1.5 | 900 | Possible to sinter |
| 2 | 33.3 | 33.3 | 33.3 | 20 | 80 | 0.5 | 870 | X-ray diffraction |
| 3 | 33.3 | 33.3 | 33.3 | 40 | 60 | 2.0 | 870 | peaks of dielectric |
| 4 | 15 | 50 | 35 | 70 | 30 | 1.5 | 900 | and magnetic |
| 5 | 35 | 50 | 15 | 80 | 20 | 1.5 | 950 | materials only |
| Comparative Example | | | | | | | | |
| 1 | — | — | — | 60 | 40 | 0 | 900 | Impossible to sinter Unknown peaks |
| 2 | — | — | — | 60 | 40 | 0 | 1050 | Possible to sinter Unknown peaks |

*The third substance is expressed in weight percentage relative to the total amount of dielectric and magnetic materials of unknown substances other than the dielectric and magnetic materials.

COMPARATIVE EXAMPLE 4

A chip was manufactured in the same manner as in the Example 1 except that no third substance was used and sintering was carried out at a higher temperature as shown in Table 2.

Although sintering was accomplished, the results revealed very poor chip properties and a very low reproducibility as shown in Table 2, and as a result of investigation of X-ray diffraction pattern at the ceramic portion of the chip, many peaks of unknown substances other than the dielectric and magnetic materials were observed.

the dielectric ceramic powder and reducing the sintering temperature. This improving agent has, for example, a composition of $CdO$—$ZnO$—$B_2O_3$, and is available by mixing CdO, ZnO and $B_2O_3$ at molar ratios of 1:1:1, then calcining the mixture at 900° C. for one hour, and milling the calcined mixture with a mill, to produce a powder having an average particle size of about 0.1 μm. In this example, a composite ceramic material having a sintering temperature of about 950° C., was obtained by mixing the magnetic ferrite powder, the dielectric ceramic powder, and the improving agent at weight ratios of 60:40:1.5.

A slurry is prepared by mixing with a mill the resultant composite ceramic material with a binder and a binder solvent which is gasifiable during sintering, and the slurry is formed into green sheets by the doctor blade method. Such

TABLE 2

| Example | Composition of third substance (mole %) | | | Blending ratio of raw materials (wt. %) | | | Sintering Temp. (°C.) | Electrostatic Capacity (pF) | Impedance (Ω) |
|---|---|---|---|---|---|---|---|---|---|
| | CdO | ZnO | $B_2O_3$ | Dielectric Material | Magnetic Material | Third Substance | | | |
| Example | | | | | | | | | |
| 6 | 1 | 2 | 1 | 60 | 40 | 1.5 | 950 | 50 ± 4 | 40 ± 3 |
| 7 | 1 | 1 | 1 | 60 | 40 | 2.0 | 950 | 50 | 40 |
| 8 | 1 | 3 | 2 | 40 | 60 | 1.5 | 950 | 24 ± 2 | 65 ± 5 |
| 9 | 2 | 3 | 1 | 60 | 40 | 2.0 | 950 | 50 | 40 |
| Comparative Example | | | | | | | | | |
| 3 | — | — | — | 60 | 40 | 0 | 950 | 15–40 | 25–39 |
| 4 | — | — | — | 60 | 40 | 0 | 1050 | 43 ± 14 | 34 ± 10 |

*The third substance is expressed in weight percentage relative to the total with dielectric and magnetic materials.

Now, the composite LC part and the composite LC chip part in the Example of the present invention are described below in further detail with reference to the drawings.

The composite LC part of the Example was manufactured by preparing a plurality of green sheets made from a magnetic ferrite powder and a dielectric ceramic powder as starting raw materials mixed at a prescribed ratio, forming the thus prepared green sheets into a lamination, forming the lamination into a chip shape and sintering same. This composite ceramic material is a composite functional material having constant magnetic permeability and permittivity.

In this Example, powder NiO, ZnO, CuO and $Fe_2O_3$ were weighed so as to achieve prescribed ratios and wet-mixed as the magnetic ferrite powder. The mixture was calcined at 1,000° C. for two hours, and then milled with a wet mill to prepare the magnetic ferrite powder having an average particles size of about 0.1 μm, and a composition of $Ni_{0.24}Zn_{0.22}Cu_{0.06}Fe_{0.96}O_{1.96}$. As the dielectric ceramic powder, powdered PbO, $La_2O_3$, $ZrO_2$ and $TiO_2$ were weighed so as to achieve the prescribed ratios and wet-mixed. The mixture was calcined at 1,150° C. for two hours, and then milled with a wet mill to prepare dielectric ceramic powder having an average particle size of about 0.1 μm, and a composition of $Pb_{0.88}La_{0.12}Zr_{0.7}Ti_{0.3}O_{3.06}$.

By mixing the resultant magnetic ferrite powder and dielectric ceramic powder at a weight ratio of 60:40, a composite ceramic material having a sintering temperature of 1,030° C. is available. The mixing ratio of the magnetic ferrite powder to the dielectric ceramic powder is preferably selected from a range of from 60 to 40:40 to 60. An improving agent is preferably added with a view to inhibiting the reaction between the magnetic ferrite powder and sheets can also be prepared by mixing and kneading the composite ceramic material with a binder and a binder solvent into a paste and forming sheets using this paste by the printing method.

A plurality of the thus prepared green sheets are formed into a lamination. A conductive paste is applied to surfaces on some of these green sheets by the screen printing method so that the conductors for the inductor are electrically insulated from the conductors for grounding. Throughholes are pierced at mutual connecting positions of the conductors for the inductor of the green sheets, and a prescribed number of sheets are formed into a lamination. The throughholes are filled with a conductive paste, as required. The resultant lamination is formed under pressure, cut into chips, and sintered into bare chips.

Figure 2B:
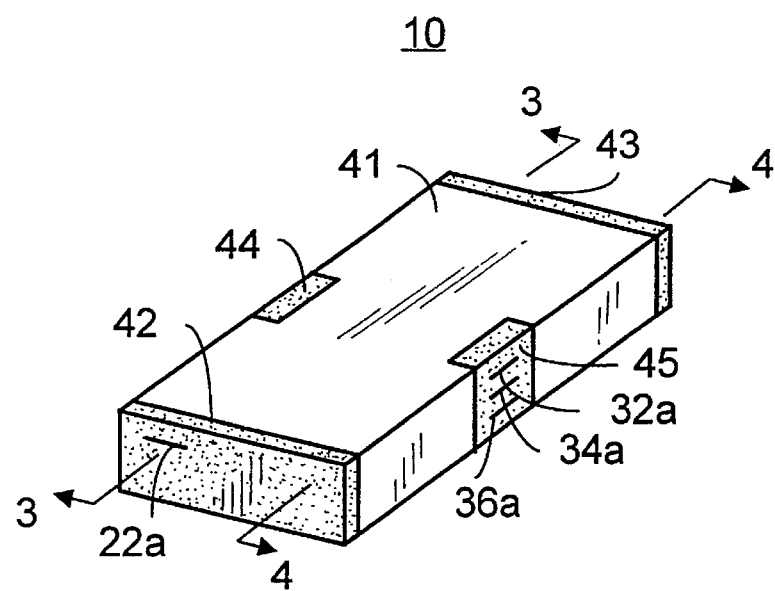
FIG. 2 (a) is an exploded perspective view illustrating green sheets before lamination of an embodiment of the composite LC part of the present invention.
Figure 2A:
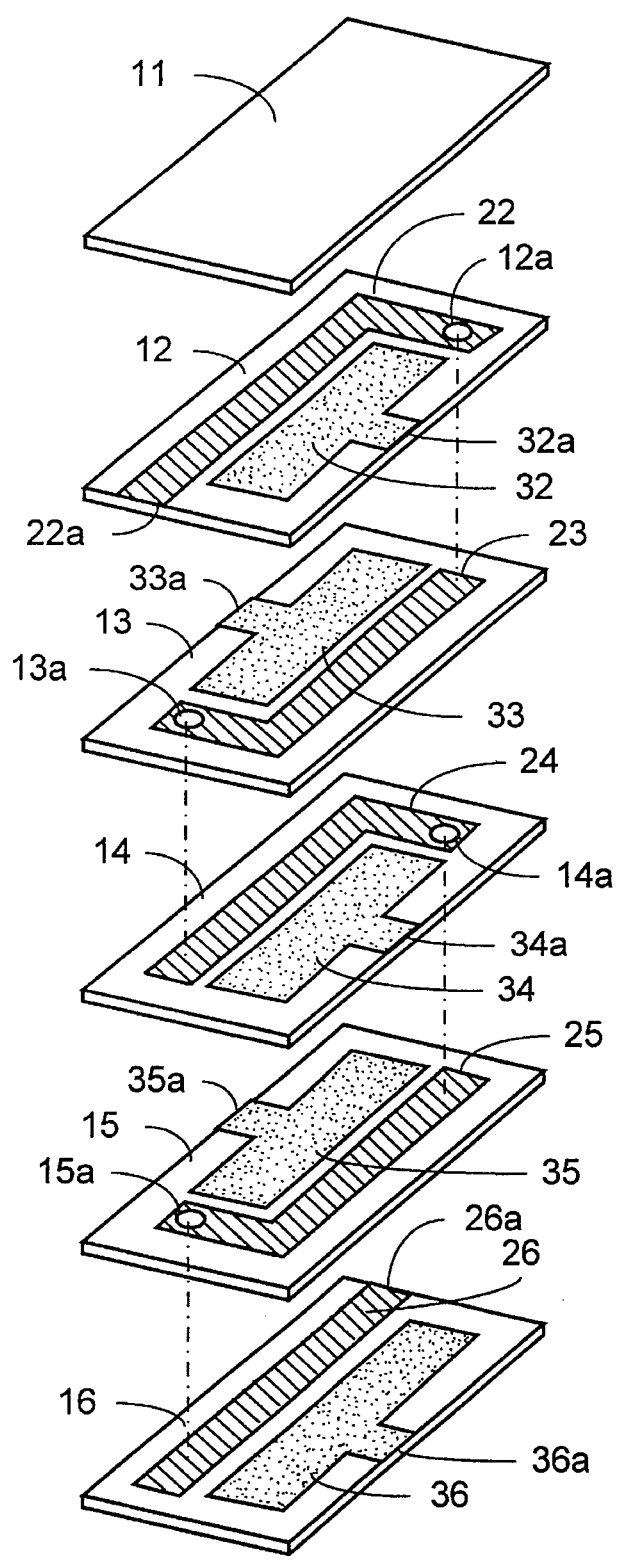

To simplify the description, as shown in FIG. 2(a), the following description covers a case where six green sheets 11 to 16 are formed into a lamination. Nothing is printed on the first green sheet 11, and no conductor is therefore formed therein. Conductors for inductor 22 to 26 and conductors for grounding 32 to 36 spaced apart to ensure electrical insulation are formed on the surfaces of the second to sixth green sheets. Throughholes 12a to 15a for connecting the conductors for inductor 22 to 25 of the second to fifth green sheets with lower conductors are provided at ends of the conductors for inductor 22 to 25, such that the five conductors for inductor 22 to 26 form a continuous spiral inductor in the thickness direction when laminated. An end 22a of the conductor for inductor 22 of the second green sheet 12 extends to the end edge of the green sheet 12, serving as the starting end of the inductor. An end 26a of the conductor for inductor 26 of the sixth green sheet 16 extends to the other end edge of the green sheet 16, serving as the terminal end of the inductor. The conductors for grounding 32 to 36 are adjacent to the conductors for inductor 22 to 26, and ends thereof 32a to 36a on a side alternately extend to the side edges of the green sheets 12 to 16.

Figure 3:
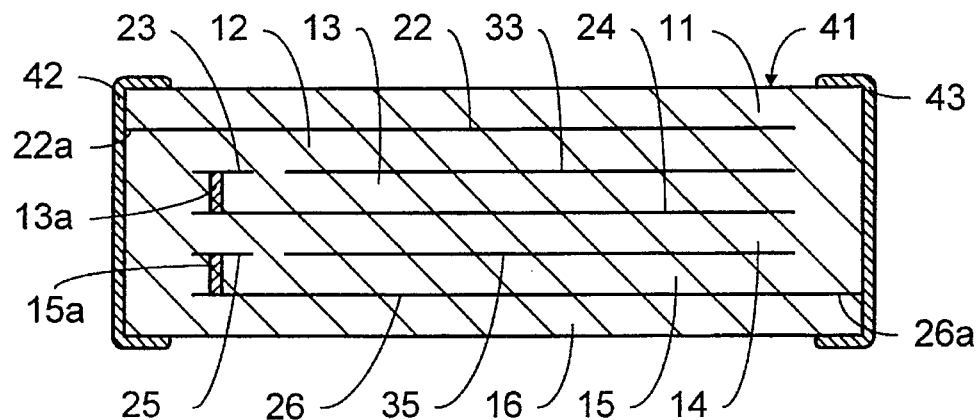
FIG. 3 is a sectional view of FIG. 2(b) cut along the line 3—3.
Figure 4:
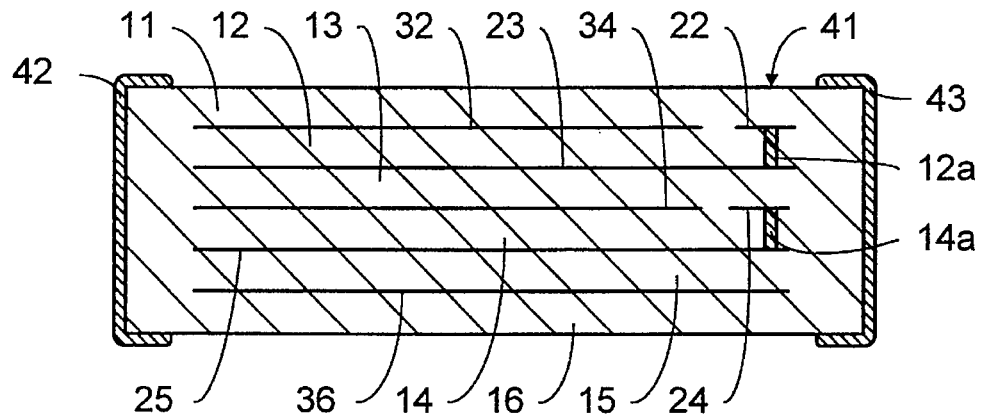
FIG. 4 is a sectional view of FIG. 2(b) cut along the line 4—4.

A rectangular parallelepiped sintered bare chip 41 is available by laminating and sintering these green sheets 11 to 16. As shown in FIGS. 2(b), 3 and 4, the end 22a of the conductor for inductor 22 serving as the starting end of the inductor is exposed on a first end face of this bare chip 41, and the end 26a of the conductor for inductor 26 serving as the terminal end of the inductor not shown is exposed on a second end face. Similarly, ends 32a to 36a of the conductors for grounding 32 to 36 are alternately exposed on third and fourth end faces of the bare chip 41. Signal electrodes 42 and 43 are formed by applying and baking a conductive paste onto the first and second end faces. Similarly, grounding electrodes 44 and 45 are formed on the third and fourth end faces, thus giving the composite LC part 10.

Figure 5:
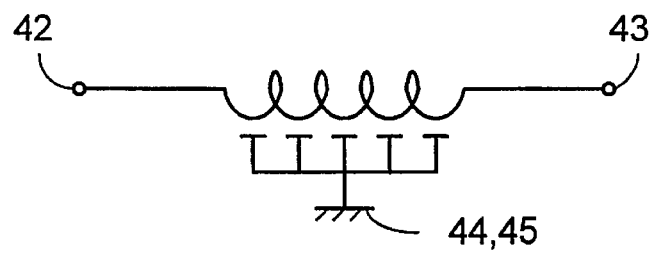
FIG. 5 is an equivalent circuit diagram of the composite LC part of FIG. 2(b)

The five conductors for inductor 22 to 26 are continuously connected via the throughholes 12a to 15a within the bare chip 41 to form an inductor. The five conductors for grounding 32 to 36 are arranged to pile up with the conductors for inductor 22 to 26 except for a conductor in a same plane, with the green sheets 122 to 125 interposed in between, such that capacitors are formed between the conductors for grounding 32 to 36 and the conductors for inductor 22 to 26. An equivalent circuit diagram is shown in FIG. 5.

Now, an example of the composite LC chip part is described below in detail with reference to the drawings.

The composite LC chip pan of this Example was manufactured by preparing a plurality of green sheets made from a mixture having a prescribed ratio of a magnetic ferrite powder, a dielectric ceramic powder, and a third substance serving to inhibit a chemical reaction between the magnetic ferrite powder and the dielectric ceramic powder and to reduce the sintering temperature of the mixture. The thus prepared green sheets were laminated together and the laminate was formed into a chip shape and sintering the same. This composite ceramic material is a composite functional material having a constant magnetic permeability and permittivity.

In this example, the same materials as in the above-mentioned example of the composite LC part were employed.

Figure 6A:
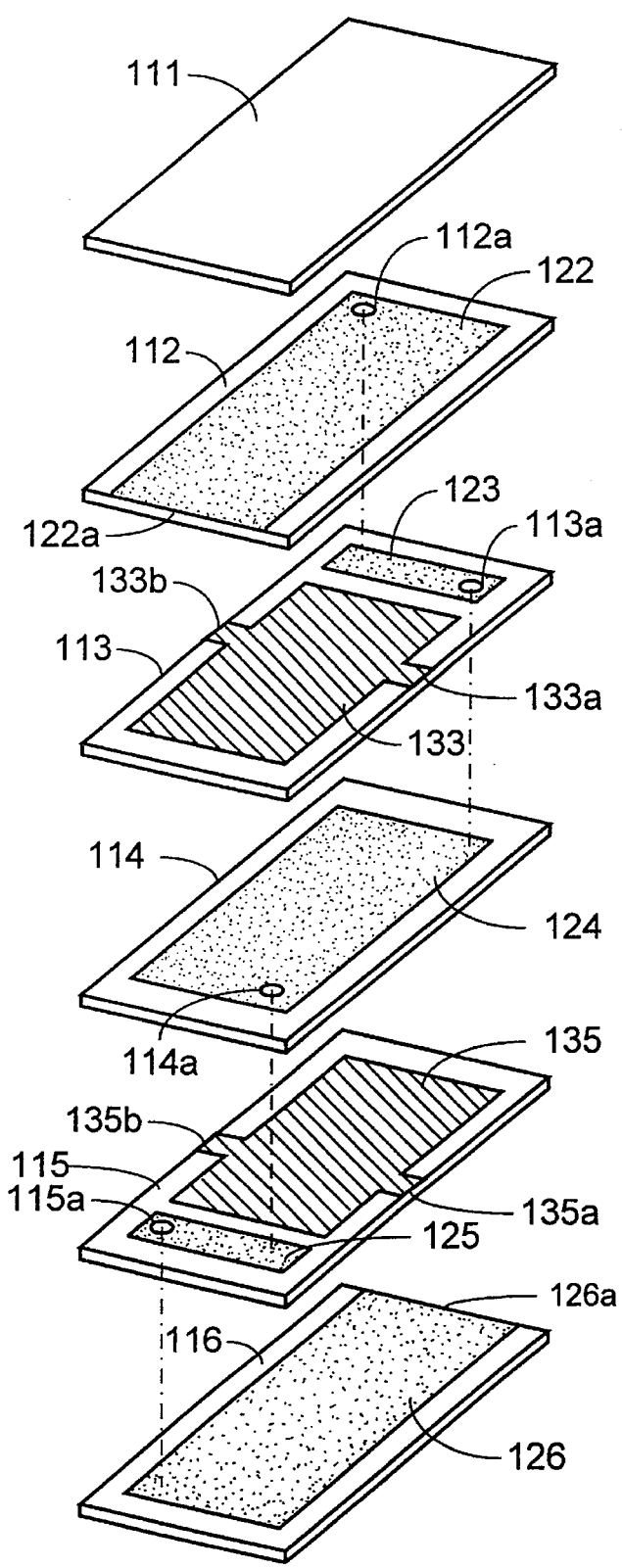
FIG. 6 (a) is an exploded perspective view illustrating green sheets before lamination of another embodiment of the composite LC chip part of the present invention.

To simplify the description, as shown in FIG. 6(a), the following description covers a case where six green sheets 111 to 116 are formed into a lamination. Nothing is printed on the first green sheet 111, and thus no conductor is formed therein. Conductors for inductor 122, 124 and 126 are formed on the surfaces of the second, fourth and sixth green sheets 112, 114 and 116, and conductors for inductor 123 and 125 and conductors for grounding 133 and 135 are formed on the surfaces of the third and fifth green sheets 113 and 115. These are spaced apart to ensure electrical insulation.

Throughholes 112a and 115a for connecting the conductors for inductor 122 to 125 of the second to fifth green sheets 112 to 115 with lower conductors for inductor the are provided at ends of the conductors for inductor 122 to 125, such that the five conductors for inductor 122 to 126 form a continuous inductor in a meander shape, i.e., a zigzag shape, when viewed in cross-section of a cut surface in the thickness direction of the laminate. An end 122a of the conductor for inductor 122 of the second green sheet 112 extends to the end edge of the green sheet 112, serving as the starting end of the inductor. An end 126a of the conductor for inductor 126 of the sixth green sheet 116 extends to the other end edge of the green sheet 116, serving as the terminal end of the inductor.

The conductors for grounding 133 and 135 are adjacent to the conductors for inductor 123 and 125, respectively, and are arranged so as to be piled up with other conductors for inductor 122, 124 and 126 with the green sheets 112 to 115 interposed in between. Ends 133a and 135a of the conductors for grounding 133 and 135 and the other ends thereof 133b and 135b extend to the two side edges opposite to the green sheets 113 and 115.

Figure 7:
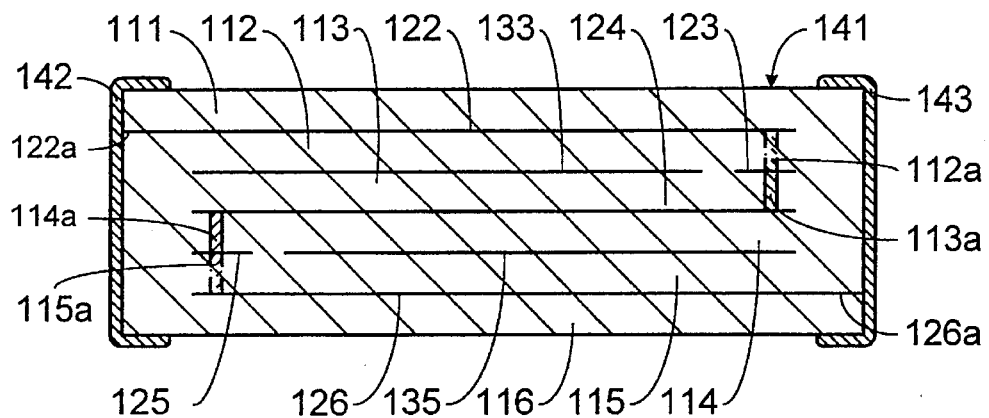
FIG. 7 is a sectional view of FIG. 6(b) cut along the line 7—7.
Figure 6B:
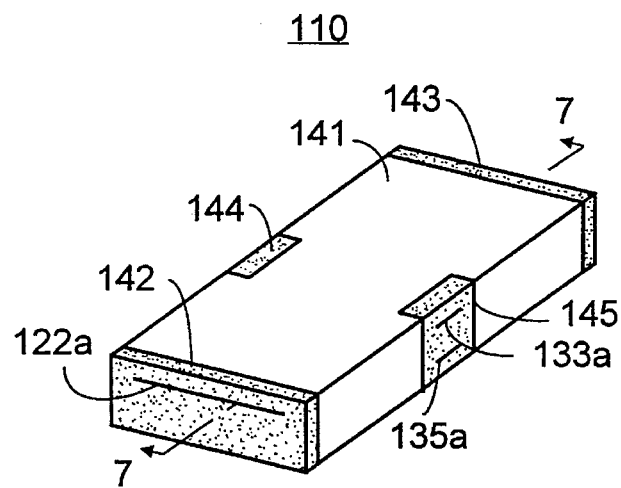

A rectangular parallelepiped sintered bare chip 141 is available by laminating and sintering these green sheets 111 to 116. As shown in FIGS. 6(b) and 7, the end 122a of the conductor for inductor 122 serving as the staffing end of the inductor is exposed on a first end face of this bare chip 141, and the end 126a of the conductor for inductor 126 serving as the terminal end of the inductor not show is exposed on a second end face. Similarly, ends 133a and 135a and the other ends 133b and 135b of the conductors for grounding 133 and 135 are exposed on third and fourth end faces of the bare chip 141. Signal electrodes 142 and 143 are formed by applying and baking a conductive paste onto the first and second end faces. Similarly, grounding electrodes 144 and 145 are formed on the third and fourth end faces, thus giving the composite LC chip part 110.

Figure 8:
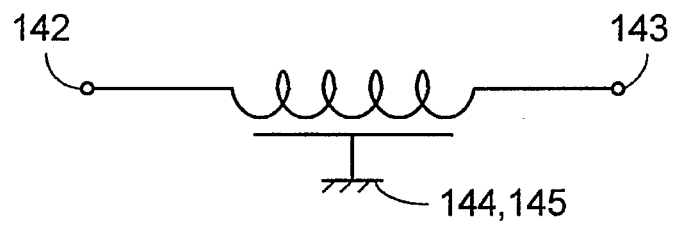
FIG. 8 is an equivalent circuit diagram of the composite LC chip part of FIG. 6(b).

The five conductors for inductor 122 to 126 are continuously connected via the throughholes 112a to 115a within the bare chip 141 to form an inductor, and the two conductors for grounding 133 and 135 form capacitors via the sheets 112 to 115 with the conductors for inductor 122, 124 and 126 overlapping therewith. An equivalent circuit diagram is shown in FIG. 8.

The composition of the magnetic ferrite powder is not limited to that shown in the above-mentioned example, but can contain one or more values selected from the group comprising Ni, Zn, Cu, Mn, Mg, and Co. The composition of the dielectric ceramic powder is not limited to lead-based, but may also be barium-titanate-based.

The composite ceramic material of the present invention described above, exhibits almost no reaction between the dielectric material and the magnetic material during sintering, so that no foreign substance produced by such a reaction is contained. This allows achievement of a high-performance composite ceramic material.

The EMI filter of the present invention, is almost free from any reaction between the dielectric material and the magnetic material during sintering and does not therefore contain foreign substances produced by such a reaction. Therefore, an EMI filter having excellent properties is provided with a high reproducibility.

According to the composite LC part and the composite LC chip part of the present invention, as described above, it is possible to simplify the manufacturing process, alleviate thermal stress to the lowest level during sintering, and avoid troubles such as strain and cracks in the bare chip, with the slightest changes in properties, because the inductor and the capacitor are formed with green sheets made from the same ceramic material.

Since the conductors for grounding are arranged so as to be adjacent to the conductor for inductor in a same plane or adjacent to the individual conductors for inductor in an upper and a lower plane, the inductor formed by these conductors for inductor is hardly susceptible to floating capacity. In addition, the present invention is applicable for the removal of noise over a wide range of frequencies as each capacitor is formed between a conductor for inductor and a conductor for grounding.

It is also possible to increase or decrease the inductance and capacitance by altering the current path of the conductors for inductor in proportion to the number of green sheets in the lamination.

Use of dielectric as well as magnetic materials permits acquisition of a sufficient inductance, and achievement of a compact and high-performance noise filter capable of being surface-mounted on a printed circuit substrate or the like.

What is claimed is:

1. A composite ceramic material comprising a sintered mixture of a dielectric material, a magnetic material, and a third component capable of inhibiting any chemical reaction between the dielectric material and the magnetic material, and reducing the temperature required to sinter the mixture, the component being present in a chemical reaction preventing and sintering temperature reducing-effective amount.

2. The composite ceramic material of claim 1 wherein said third component is a $CdO$—$ZnO$—$B_2O_3$-based substance.

3. The composite material as claimed in claim 1 wherein the ratio of said dielectric material to said magnetic material is from 20 to 80 wt. % for the dielectric material and from 20 to 80 wt. % for the magnetic material, relative to a total amount of the dielectric material and the magnetic material.

4. The composite material as claimed in claim 1 wherein said third component is present in an amount of from 0.05 to 3 wt. % relative to a total amount of said dielectric material and said magnetic material.

5. The composite material of claim 1, wherein said third component is in an amount of from 0.1 to 2 wt. % relative to a total amount of said dielectric material and said magnetic material.

6. A three-terminal capacitor-shaped EMI filter comprising a sintered mixture of a dielectric material, a magnetic material, and a third component capable of inhibiting any chemical reaction between the dielectric material and the magnetic material, and reducing the temperature required to sinter the mixture, the component being present in a chemical reaction preventing and sintering temperature reducing-effective amount.

7. The EMI filter of claim 6 wherein said third component is a $CdO$—$ZnO$—$B_2O_3$-based substance.

8. A composite LC part which comprises:

a bare chip of a laminate of a plurality of green ceramic sheets superposed one atop the other and sintered together, the ceramic comprising a sintered mixture of a dielectric material, a magnetic material, and a third component capable of inhibiting any chemical reaction between the dielectric material and the magnetic material, and reducing the temperature required to sinter the mixture, the component being present in a chemical reaction preventing and sintering temperature reducing-effective amount, first conductors for an inductor and second conductors for grounding formed on each green sheet except at least the topmost green sheet, such that conductors for the inductor and conductors for grounding are electrically insulated, said first conductors connected spirally in series vertically in the bare chip via electrically conductive throughholes in said sheets, a starting end thereof being exposed on a first end face of said bare chip, and a terminal end thereof being exposed on a second end face of said bare chip;

capacitors are formed between said first and second conductors, said first conductors being adjacent to and spaced apart from said second conductors so as to be electrically insulated from one another in a same plane within said bare chip, said second conductors being stacked with the first conductors except for a first conductor in the same plane, with the green sheets interposed therebetween, said second conductors having ends exposed in alternating manner on third and fourth end faces, respectively, of said bare chip;

first and second signal electrodes electrically connected to the starting end and the terminal ends, respectively, of the first conductors, said first and second signal electrodes being provided on said first and second end faces; and first and second grounding electrodes being provided on said third and fourth end faces and being electrically connected to the exposed ends on one side of the second conductors.

9. The composite LC part of claim 8 wherein said third substance is a $CdO$—$ZnO$—$B_2O_3$-based substance.

10. A composite LC chip part which comprises:

a bare chip of a laminate of a plurality of green ceramic sheets superposed one atop the other and sintered together, the ceramic comprising a sintered mixture of a dielectric material, a magnetic material, and a third component capable of inhibiting any chemical reaction between the dielectric material and the magnetic material, and reducing the temperature required to sinter the mixture, the component being present in a chemical reaction preventing and sintering temperature reducing-effective amount, first conductors for an inductor formed on each green sheet except at least the topmost green sheet, and second conductors for grounding formed on every other green sheet except at least the topmost green sheet such that conductors for the inductor and conductors for grounding are electrically insulated, said first conductors connected in a zig-zag shape in series vertically in the bare chip via electrically conductive throughholes in said sheets, a starting end thereof being exposed on a first end face of said bare chip, and a terminal end thereof being exposed on a second end face of said bare chip;

capacitors are formed between said first and second conductors, said first conductors being adjacent to and spaced apart from said second conductors so as to be electrically insulated from one another in a same plane within said bare chip, said second conductors being stacked on and under the first conductors except for a first conductor in the same plane, with the green sheets interposed therebetween, said second conductors having ends exposed on third and fourth end faces of said bare chip;

first and second signal electrodes electrically connected to the starting end and the terminal ends, respectively, of the first conductors, said first and second signal electrodes being provided on said first and second end faces; and first and second grounding electrodes being provided on said third and fourth end faces and being electrically connected to the exposed ends on both sides of the second conductors.

11. The composite LC chip part of claim 10 wherein said third component is a $CdO$—$ZnO$—$B_2O_3$-based substance.

12. A composite ceramic material comprising a sintered mixture of a dielectric material, a magnetic material, and a third component capable of inhibiting any chemical reaction between the dielectric material and the magnetic material, and reducing the temperature required to sinter the mixture, the component being present in a chemical reaction preventing and sintering temperature reducing-effective amount, wherein said third component is present in an amount of from 0.05 to 3 wt. % relative to a total amount of said dielectric material and said magnetic material.

* * * * *